United States Patent [19]

Bion et al.

[11] Patent Number: 5,604,455
[45] Date of Patent: Feb. 18, 1997

[54] TRANSITION DETECTION DEVICE GENERATING A VARIABLE-DURATION PULSE

[75] Inventors: Thierry Bion, Nantes; Jean-Yves Danckaert, La Chapelle Sur Erdre, both of France

[73] Assignee: Matra MHS, Nantes, France

[21] Appl. No.: 441,734

[22] Filed: May 16, 1995

[30] Foreign Application Priority Data

Jun. 1, 1994 [FR] France ................... 94 06694

[51] Int. Cl.⁶ .................... H03K 7/00; H03K 19/00
[52] U.S. Cl. .................... 327/176; 327/299; 327/276; 327/43
[58] Field of Search ............... 327/39, 40, 41, 327/42, 43, 44, 46, 47, 49, 113, 114, 116, 119, 172, 269, 270, 276, 277, 173, 174, 175, 176, 298, 299; 326/55

[56] References Cited

U.S. PATENT DOCUMENTS

| | | | |
|---|---|---|---|
| 4,644,184 | 2/1987 | Miyawaki et al. | 327/270 |
| 4,775,805 | 10/1988 | Whitefoot | 327/113 |
| 4,775,810 | 10/1988 | Suzuki et al. | 326/55 |
| 4,799,022 | 1/1989 | Skierszkan | 327/277 |
| 4,843,331 | 6/1989 | Yang | 327/113 |
| 4,905,192 | 2/1990 | Nogami et al. | 327/276 |
| 4,975,605 | 12/1990 | Bazes | 327/270 |
| 5,039,893 | 8/1991 | Tomisawa | 327/277 |
| 5,185,540 | 2/1993 | Boudry | 327/276 |
| 5,197,082 | 3/1993 | Uda et al. | 327/44 |
| 5,365,128 | 11/1994 | Bazes | 327/277 |

FOREIGN PATENT DOCUMENTS

87/00340   1/1987   WIPO .

OTHER PUBLICATIONS

IBM Technical Disclosure Bulletin "Frequency Doubles" F. C. Breslau, vol. 10 No. 6 Nov. 1967.
Electronic Engineering, "Square Wave Division for Symmetrical Outputs", Nair et al. vol. 49, No. 592 May 1977.

Primary Examiner—Timothy P. Callahan
Assistant Examiner—Eunja Shin
Attorney, Agent, or Firm—Larson and Taylor

[57] ABSTRACT

A transition detection device, generating a variable-duration pulse, such as an enable signal for the input circuits of a CMOS static memory circuit, receiving an input signal that includes a delay circuit of determined delay value, making it possible to generate a delayed enable signal, with a safety margin of duration equal to the delay value. A calibration circuit is provided, which includes an exclusive-OR circuit receiving the input signal on a first input. A controlled delay circuit is provided to deliver an input signal delayed by a second delay value to a second input of the exclusive-OR circuit, which, upon access by the CEB signal, delivers a calibrated output pulse of duration equal to the second delay value, and truncated pulses for any transition occurring on the other inputs of the circuit, in the presence of address transitions or of other, not strictly simultaneous, inputs.

5 Claims, 2 Drawing Sheets

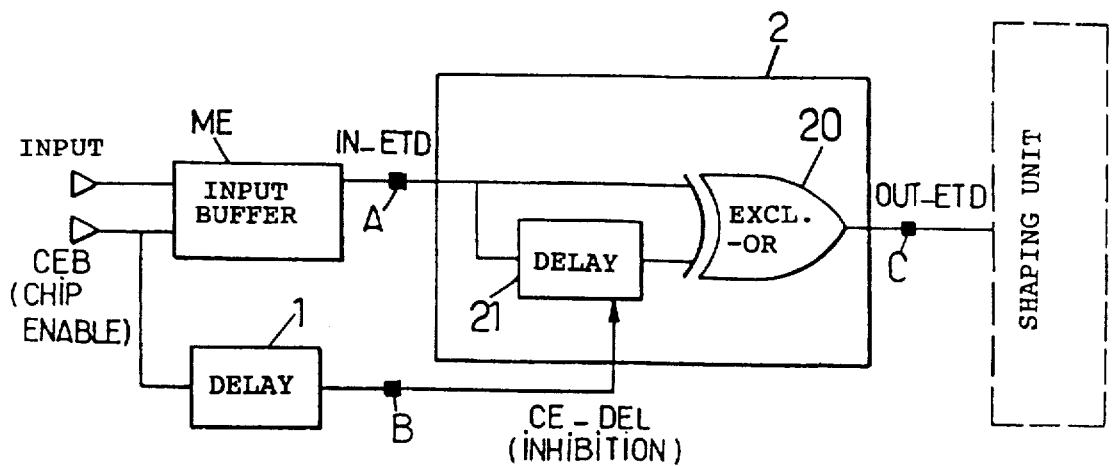
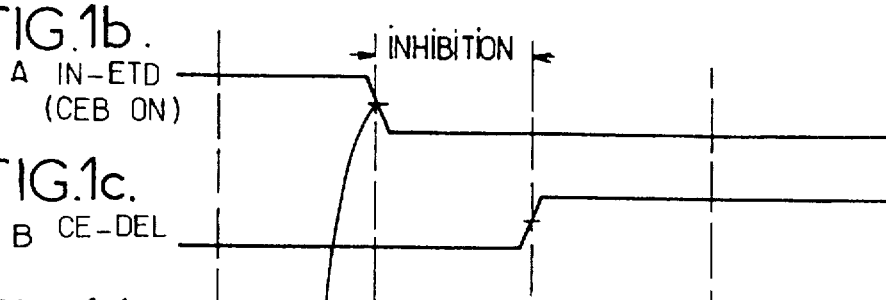
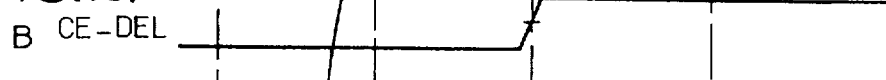
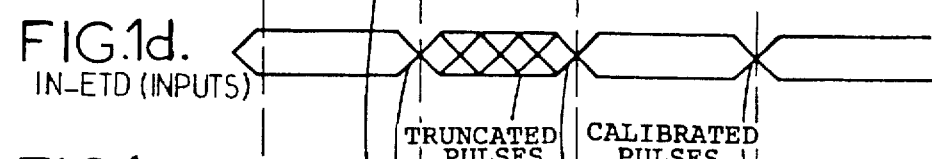
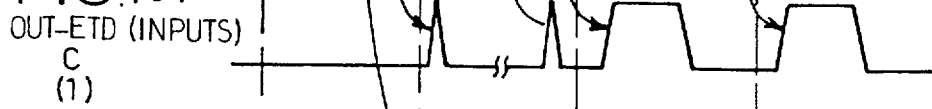

TRANSITION DETECTION DEVICE GENERATING A VARIABLE-DURATION PULSE

BACKGROUND OF THE INVENTION

1. Field of the Invention

The invention relates to a transition detection device generating a variable-duration pulse.

2. Description of the Prior Art

When using input circuits of a CMOS static memory circuit, an enable signal, designated by "chip enable", CEB, makes it possible to control access to these input circuits.

When controlling access by means of the enable signal, CEB, it is necessary to inhibit the pulses generated by the other inputs of the input circuit so as to avoid the appearance of multiple or stretched pulses.

SUMMARY OF THE INVENTION

The subject of the present invention is the use of a transition detection device making it possible to generate a variable-duration pulse and to inhibit the pulses generated by the other inputs of the input circuit.

The transition detection device generating a variable-duration pulse, such as an enable signal (CEB) for the input circuits of a CMOS static memory circuit, which is the subject of the present invention, these input signals, on being enabled, delivering an input signal from the signal representing an input digital signal to be stored by the static memory, is noteworthy in that it includes a first circuit for delaying the enable signal by a first determined delay value, making it possible to generate a delayed enable signal and to introduce a safety margin of a duration equal to the first delay value. A circuit for calibration of the input signal is provided, which comprises an exclusive-OR logic circuit receiving the input signal on a first input, and a second controlled delay circuit receives the said input signal and delivers an input signal delayed by a second delay value. The second controlled delay circuit is connected to a second input of the exclusive-OR logic circuit, which delivers a calibrated output signal formed by a pulse the duration of which is equal to the second delay value upon access by the enable signal and truncated pulses in the presence of address transitions or of other, not strictly simultaneous, inputs.

The device which is the subject of the present invention finds an application in the production and of CMOS-type static memory circuits.

BRIEF DESCRIPTION OF THE DRAWINGS

It will be better understood on reading the description and studying the drawings below, in which:

FIG. 1a represents a block diagram of the transition detection device, which is the subject of the present invention;

FIGS. 1b to 1f are timing diagrams of the signals at various test points of FIG. 1a;

FIG. 2 represents a non-limiting advantageous embodiment detail of the device represented in FIG. 1a.

DESCRIPTION OF THE PREFERRED EMBODIMENTS

Figure 2:
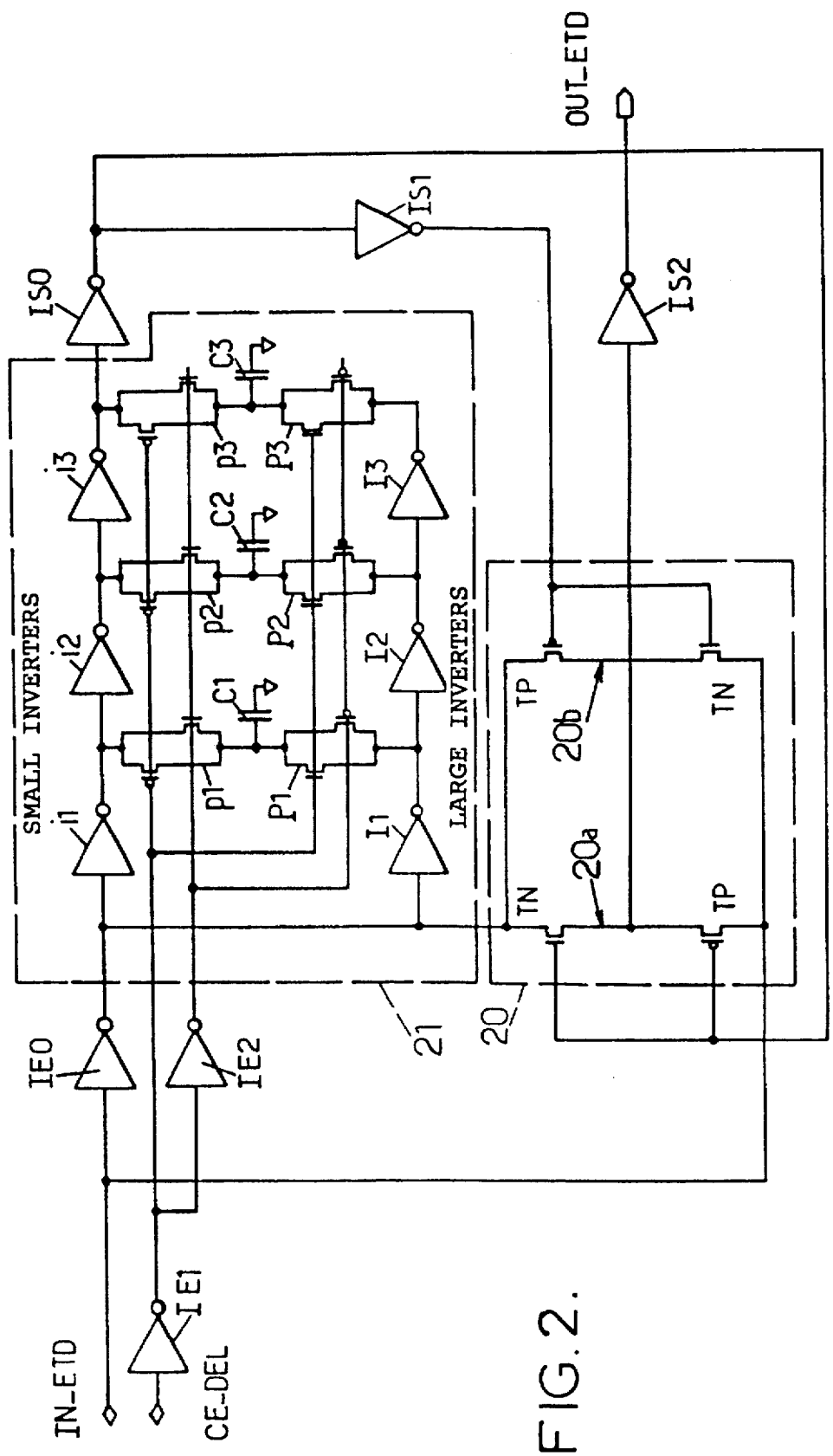

A more detailed description of a transition detection device generating a variable-duration pulse, which is the subject of the present invention, will now be given in connection with FIG. 1a.

In the abovementioned figure, an input signal, representing an input digital signal coded over a plurality N of bits, N=8, for example, has been represented.

The input digital signal, designated by INPUT, has to be interpreted by a static memory via a shaping unit, represented in broken line in FIG. 1a. As far as the abovementioned figure is concerned, it is pointed out that it relates to the block diagram of a circuit allowing processing of one of the bits of the input digital signal. That being so, it is understood, in accordance with one aspect of the transition detection device generating a variable-duration pulse, which is the subject of the present invention, that a comparable circuit is present and operational in identical conditions for each of the bits constituting the input digital signal.

The abovementioned input digital signal, and in particular one of the bits of it, represented by the signal INPUT, is normally stored within an input matching circuit designated by "input buffer" circuit, such a circuit further including a signal for enabling the input matching circuit, this circuit bearing the reference ME in FIG. 1a.

In current devices, the output of the input matching circuit ME is linked to a unit for shaping the signals of the circuit, represented in broken line in the abovementioned FIG. 1a.

According to a particularly advantageous aspect of the transition detection device generating a variable-duration pulse, which is the subject of the invention, this transition is such that the input matching circuit ME, in the presence of the enable signal CEB, conventionally delivers, at the output of the input matching circuit ME, a signal denoted IN-ETD, which is normally intended to be interpreted by the static memory.

According to another particularly advantageous aspect of the detection device, which is the subject of the present invention, it is understood that the device comprises a first circuit, denoted 1, for delaying the enable signal CEB by a first determined delay value, this signal corresponding to the designation "Chip enable" and having the effect of authorizing access to the circuit. The first delay circuit 1 makes it possible to generate a delayed enable signal, denoted CE-DEL, while making it possible to introduce a safety margin of duration equal to the first delay value, that is to say to the delay value introduced by the first delay circuit 1.

Moreover, the transition detection device, which is the subject of the present invention, includes a circuit 2 for calibrating the input signal to be stored, denoted IN-ETD, this calibration circuit including an exclusive-OR logic circuit, denoted 20, receiving the input signal to be interpreted on a first input, and a second controlled delay circuit, denoted 21, receiving the abovementioned input signal to be detected and delivering an input signal delayed by a second delay value. It will be noted that the second controlled delay circuit 21 is connected to a second input of the exclusive-OR logic circuit, which, upon a demand for access by the enable signal CEB, delivers a calibrated output signal, formed by a pulse the duration of which is equal to the second delay value, that is to say to the delay value of the second delay circuit 21. In contrast, and still upon access by the enable signal CEB, but in the presence of transitions on the other inputs of the circuit, the exclusive-OR circuit 20 delivers a series of truncated pulses, not recognized as a pulse, as will be described later in the description. The signal 2 for calibrating the input signal to be stored delivers an output signal, denoted OUT-ETD, which is delivered to the shaping unit, represented in dashes in FIG. 1a, and consists either of truncated pulses or of the calibrated pulse.

In FIGS. 1b to 1f, the various signals at the test points A, B, C of FIG. 1a have been represented. Moreover, it will be recalled that the input signal, denoted INPUT, corresponds to the value of the set of bits over which this signal is coded, an alteration of one of the values of these bits being represented in FIGS. 1b to 1f in a general way without reference to the test points A, B, C. This alteration is deemed to occur at the test point A of FIG. 1a, that is to say, for the bit in question, shaped by the input matching circuit ME and generating the input digital signal IN-ETD intended to be interpreted by the static memory.

Upon transition by the input digital signal, IN-ETD, to be detected at the test point A (FIG. 1b), and upon access by the enable signal CEB, the delayed enable signal CE-DEL at point B (FIG. 1c) remains at the value 0 and inhibition is present as long as the delayed enable signal remains at the abovementioned value 0. The calibration circuit 2, during the inhibition time, delivers truncated pulses the duration of which is less than or equal to one nanosecond for example, for any transition caused by an address access, these truncated pulses (FIG. 1d) then not being recognized as such by the shaping unit circuit. The corresponding shape of the signal is represented in FIG. 1e, at C(1), for test point C.

In contrast, with the enable signal CEB being active, for the input circuit for which access imposed by the enable signal CEB is achieved, the address access then being masked, the signal delivered by the calibration circuit 2 associated with this input circuit at test point C corresponds to a calibrated output signal formed by a pulse the duration of which is equal to the second delay value of the delay circuit 21. This signal is represented at C(2) in FIG. 1f.

A more detailed description of an advantageous embodiment of the second delay circuit 21 will now be given in connection with FIG. 2. In a general way, it is pointed out that the second delay circuit 21, a controlled delay circuit, is formed by a plurality of delay cells connected in cascade. In FIG. 2, it is pointed out that three delay cells only are represented by way of example.

Each delay cell includes at least one inverter, denoted i1, i2, i3, connected to a transfer gate, denoted p1, p2, p3, itself connected to an electrical capacitor linked to the reference voltage, each electrical capacitor being denoted C1, C2, C3.

Each transfer gate p1, p2, p3 is driven into the conducting or non-conducting state by the delayed enable signal CE-DEL. Thus, each cell makes it possible to introduce onto the input signal, IN-ETD, to be stored an elementary delay, denoted T, which is equal to the time constant formed by the circuit for charging the corresponding electrical capacitor C1, C2, C3. In the embodiment of FIG. 2, it is pointed out that the delay cells receive the complemented input signal, denoted $\overline{IN-ETD}$, via an input inverter, denoted IE0.

In a conventional way, it is pointed out that each transfer gate p1, p2, p3 can be formed by a first and a second P-type or N-type MOS transistor respectively, which are connected in parallel, the gate electrode of the first P MOS transistor being driven by the complemented delayed enable signal $\overline{CE-DEL}$ via an input inverter IE1, while the gate electrode of the second N MOS transistor is driven by the delayed enable signal CE-DEL obtained from the drive signal of the gate electrodes of the P-type MOS transistors after further complementing by an input inverter IE2.

As for the exclusive-OR circuit 20, it is pointed out that it can be formed, in an integrable version, by a first and a second branch, denoted 20a, 20b, each branch being formed by an N MOS transistor and a P MOS transistor, denoted TN, TP for each of the branches, the abovementioned transistors being mounted in cascade and the two branches 20a, 20b being connected in parallel between the input of the first delay cell, that is to say, in fact, the input of the first inverter I1, a delay cell receiving the complemented input signal $\overline{IN-ETD}$ via the input inverter IE0, and the output of the input storage circuit ME, that is to say the input of this same input inverter IE0. The gate electrodes of the TN or TP MOS transistors respectively of the first branch 20a are connected to the output of the second delay cell, that is to say, in fact, to the output of the inverter i3 via an output inverter, denoted IS0. The gate electrodes of the transistors TP, TN of the second branch 20b are connected to the output of the first output inverter IS0 via a second output inverter, denoted IS1. The common point between the transistors TN, TP of the first branch 20a delivers the calibrated pulse output signal or truncated pulses, denoted OUT-ETD, via a third output inverter, denoted IS2.

The operation of the device as represented in FIG. 2 is as follows: The enable signal CEB is complemented and delayed internally by the value of the first delay, for example by the first delay circuit 1 by a value of 5 nanoseconds, in order to generate the delayed enable signal, denoted CE-DEL, at the test point B, this signal being common to each of the devices as represented in FIG. 1a associated with one bit of the input digital signal.

Upon access to the static memory by means of the enable signal CEB, this signal being active when it is at the 0 value, the delayed enable signal CE-DEL has the effect of disconnecting the capacitors C1, C2, C3 from the output of their associated inverters i1, i2, i3 for a duration equal to the abovementioned internal delay. The time margin calibrating the width of the pulse is now supplied only by the abovementioned inverters i1, i2, i3 alone, and is consequently drastically reduced to a value less than or equal to 1 nanosecond. Thus, any transition of the input signal occurring within the period of time lying between the respective transitions of the enable CEB and delayed enable CE-DEL signals thus gives rise to the creation of a truncated pulse, as previously mentioned.

In contrast to the other input signals, the transition detection device as represented in FIG. 1a, with which the enable signal CEB is associated, then sees its delayed enable signal CE-DEL forced to the value of the power supply voltage VCC, which has the effect of inhibiting the previously described truncation process, the capacitors C1, C2, C3 being continuously connected to their respective inverters i1, i2, i3. The pulse associated with the enable signal CEB is then calibrated at the desired duration, established by the value of the previously mentioned delay cells.

In FIGS. 1b to 1f, it is pointed out that the truncated pulses and the calibrated pulse (FIG. 1d) are represented at points C(1) (FIG. 1e and) C(2) (FIG. 1f), respectively, corresponding to the case in which, the enable signal CEB being active at 0, the transitions relate to the addresses and to the enable signal CEB respectively.

Upon access by means of the enable signal CEB, and in the case of an non-simultaneous input transition, the offset between the other inputs and the enable signal CEB may be at most equal to the internal delay of the delayed enable signal with respect to the abovementioned enable signals. Thus the superimposition of the various pulses generated is avoided, the consequence of which would be to penalize the time for access by means of the enable signal CEB. The differential read phase becomes effective only at the end of the pulse, and the duration of the latter is increased by the sum of all the other pulses, and thus the time for the data item to appear at the output is increased, the reference still being the falling edge of the input signal corresponding to the enable signal CEB.

Thus it will be understood that, by virtue of the abovementioned mechanism, input pulses are inhibited and the nominal calibration of the pulse is given by the transition detection device or circuit associated with the enable signal CEB.

In one particularly advantageous variant embodiment, as represented in FIG. 2, it is pointed out that the second delay circuit 21, controlled delay circuit, may further include a chain for charging and for discharging each electrical capacitor C1, C2, C3 constituting an elementary delay cell with the transfer gates p1, p2, p3 and the associated inverters i1, i2, i3.

As will be observed in FIG. 2, it is pointed out that the charging and discharging chain, within each delay cell, includes a charging and discharging cell with short time constants. Each charging and discharging cell comprises a charging and discharging inverter, denoted respectively I1, I2, I3, connected to a charging and discharging transfer gate, each of the charging and discharging transfer gates being denoted P1, P2, P3.

As will be observed in the abovementioned FIG. 2, each charging and discharging transfer gate P1, P2, P3 is connected between the output of the charging and discharging inverter which is associated with it, I1, I2, I3 respectively, and the electrical capacitor of the corresponding delay cell C1, C2 and C3. The transfer gates p1, p2, p3 and the charging and discharging transfer gates P1, P2, P3 are driven in opposition by the complemented delayed enable signal, that is to say by the signal $\overline{\text{CE-DEL}}$ delivered by the input inverter IE1, and by the delayed enable signal CE-DEL after being double-complemented by the input inverters IE1, IE2.

The preferred embodiment described makes it possible to change from a truncated pulse to a pulse of calibrated width, this change or transition being as abrupt as possible so as to avoid intermediate pulse durations the consequence of which would be a deterioration in the dynamic performance of the circuit.

In a general way, it is pointed out that the critical time-based region within which this phenomenon must be avoided corresponds to the end of the internal delay of the delayed enable signal CE-DEL with respect to the enable signal CEB, the end of the period of inhibition of the pulses. An input transition occurring at this instant is sufficiently far from the transition of the enable signal CEB to be interpreted as the initialization of a new internal cycle. It is therefore vital to change very rapidly from a truncated-pulse state to a calibrated-pulse state without pulses of intermediate duration being generated.

The abovementioned conditions are ensured by the system for charging and for discharging the capacitors, which is controlled by the input signal IN-ETD to be stored, which is a function of the positioning of the address and active during the inhibition phase. During this phase, the capacitors C2, C2, C3 are charged no longer by the inverters i1, i2, i3 controlling the delay margin, but by the parallel substitution chain formed by the inverters I1, I2 and I3 which, of greater size, allow near-instantaneous charging or discharging. At the end of the inhibition phase, the capacitors C1, C2, C3 which are thus in a favourable state are reconnected to the small inverters i1, i2, i3 controlling the duration of the delay margin and the processing of the following transition can then take place normally.

We claim:

1. A signal processing circuit, comprising:
   a plurality of input buffer circuits, a shaping circuit for a CMOS static memory circuit and a transition detection device receiving an enable signal and a buffered digital input signal from one of said plurality of input buffer circuits and providing a pulse of predetermined duration to said shaping circuit, wherein a plurality of buffered digital input signals from said plurality of input buffer circuits are enabled by said enable signal, said transition detection device comprising:
   a first delay circuit for receiving said enable signal and generating a delayed enable signal delayed by a first delay value; and
   a calibration circuit for calibrating the buffered input signal received from said one input buffer circuit, said calibration circuit comprising:
      a second controlled delay circuit, controlled by said delayed enable signal, for receiving said buffered input signal and providing a delayed buffered input signal comprising a pulse of duration equal to a second delay value; and
      an exclusive-OR logic circuit, having a first input for receiving said buffered input signal, a second input for receiving said delayed buffered input signal and an output for providing an output signal to said shaping circuit comprising a pulse of duration equal to said second delay value only when said delayed enable signal is present simultaneously with a single buffered digital input signal.

2. A circuit according to claim 1, wherein said second controlled delay circuit comprises a plurality of delay cells connected in series, each delay cell including at least one inverter connected to a transfer gate, said transfer gate being connected to a capacitor connected to a reference voltage, said capacitor and said transfer gate determining a time constant, said transfer gate being selectively driven to a conducting state or a non-conducting state by said delayed enable signal, each cell thus introducing into said buffered input signal an elementary delay equal to said time constant, and the first delay cell of said plurality of delay cells receiving a complemented buffered input signal.

3. A circuit according to claim 2, wherein said exclusive-OR circuit includes first and second branches each formed by an N MOS transistor and a P MOS transistor connected in series, the first and second branches being connected in parallel between the input of the first delay cell receiving the complemented buffered input signal via a first inverter and the output of the buffer input circuit producing said buffered input signal, the gate electrode of the N MOS and P MOS transistors of the first branch being connected to the output of the last delay cell via a second inverter, and the gate electrode of the P MOS and N MOS transistors of the second branch being connected to the output of the second inverter via a third inverter, a common point between the N MOS and P MOS transistors of the first branch producing said calibrated output signal via a fourth inverter.

4. A circuit according to claim 3, wherein each transfer gate comprises a first, P MOS transistor and a second, N MOS transistor connected in parallel, the gate electrode of said first P MOS transistor being driven by a complemented delayed enable signal through a fifth inverter and the gate electrode of said second N MOS transistor being driven by said delayed enable signal.

5. A circuit according to claim 2, wherein said second controlled delay circuit further includes a chain for charging and discharging each capacitor constituting an elementary delay cell, said charging and discharging chain, within each delay cell, including a charging and discharging cell, of short time constant, and each charging and discharging cell comprising a charging and discharging inverter connected to a charging and discharging transfer gate, each charging and discharging transfer gate being connected between the output of the charging and discharging inverter associated therewith and the capacitor of the corresponding delay cell, the transfer gate and the charging and discharging transfer gate being driven in opposition by a complemented delayed enable signal and by said delayed enable signal.

\* \* \* \* \*